United States Patent
Choi

(10) Patent No.: US 11,942,292 B2
(45) Date of Patent: Mar. 26, 2024

(54) CONTACT POINT MONITORING MODULE DEVICE FOR VACUUM CIRCUIT BREAKER AND VACUUM CIRCUIT BREAKER COMPRISING SAME

(71) Applicant: LS ELECTRIC CO., LTD., Anyang-si (KR)

(72) Inventor: E-Jae Choi, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 275 days.

(21) Appl. No.: 17/602,158

(22) PCT Filed: Mar. 9, 2020

(86) PCT No.: PCT/KR2020/003287
§ 371 (c)(1),
(2) Date: Oct. 7, 2021

(87) PCT Pub. No.: WO2020/209507
PCT Pub. Date: Oct. 15, 2020

(65) Prior Publication Data
US 2022/0199341 A1  Jun. 23, 2022

(30) Foreign Application Priority Data

Apr. 8, 2019  (KR) .................. 10-2019-0040647

(51) Int. Cl.
*H01H 33/664* (2006.01)
*G01R 31/327* (2006.01)
*H01H 33/666* (2006.01)

(52) U.S. Cl.
CPC ..... *H01H 33/6642* (2013.01); *G01R 31/3274* (2013.01); *H01H 33/666* (2013.01); *H01H 2033/6667* (2013.01)

(58) Field of Classification Search
CPC ............. H01H 33/6642; H01H 33/666; H01H 33/664; H01H 2033/6667;
(Continued)

(56) References Cited

U.S. PATENT DOCUMENTS 5,459,293 A * 10/1995 Hodkin .................. H02B 11/12
361/609
6,002,560 A * 12/1999 Nguyen ............... H01H 1/0015
361/115

(Continued)

FOREIGN PATENT DOCUMENTS

CN          101813750 A     8/2010
JP          2006310133 A    11/2006
(Continued)

OTHER PUBLICATIONS

International Search Report for related International Application No. PCT/KR2020/003287; report dated Oct. 15, 2020; (5 pages).

(Continued)

*Primary Examiner* — William A Bolton
(74) *Attorney, Agent, or Firm* — K&L Gates LLP

(57) ABSTRACT

The present disclosure relates to a contact point monitoring module for a vacuum circuit breaker and a vacuum circuit breaker comprising the same. The present disclosure provides a vacuum circuit breaker comprising a push rod assembly which is coupled to a movable electrode of a vacuum interrupter and moves the movable electrode up or down to make a movable contact in a contact closed state or a contact open state, wherein the vacuum circuit breaker comprises a linear sensor which is coupled to a lower side of the push rod assembly and senses displacement according to a moving direction of the push rod; and a sensor holder which is installed adjacent to the lower side of the push rod (Continued)

assembly and is coupled to the linear sensor to process a signal transferred from the linear sensor.

5 Claims, 6 Drawing Sheets

(58) Field of Classification Search
CPC ......... H01H 2033/6668; H01H 1/0015; G01R 31/3274; G01R 31/333; H02H 3/04
USPC .................................. 218/118, 120, 123, 140
See application file for complete search history.

(56) References Cited

U.S. PATENT DOCUMENTS

| | | |
|---|---|---|
| 7,098,418 B1 | 8/2006 | Yamada et al. |
| 7,417,554 B2 | 8/2008 | Benke et al. |
| 8,952,826 B2 * | 2/2015 | Leccia ............... H01H 33/6662 |
| | | 218/123 |
| 9,218,923 B2 * | 12/2015 | Johansson ............. H01H 73/12 |
| 9,378,901 B2 * | 6/2016 | Ashtekar .............. H01H 33/666 |
| 9,633,808 B2 * | 4/2017 | Ricciuti ............... H01H 1/0015 |
| 10,012,697 B2 * | 7/2018 | Yang .................... H01H 33/666 |
| 10,211,018 B2 * | 2/2019 | Zhuang .................... G01L 1/22 |
| 2016/0141117 A1 | 5/2016 | Ashtekar et al. |

FOREIGN PATENT DOCUMENTS

| | | |
|---|---|---|
| KR | 101860348 B1 | 5/2018 |
| KR | 20180107547 A | 10/2018 |

OTHER PUBLICATIONS

Written Opinion for related International Application No. PCT/KR2020/003287; report dated Oct. 15, 2020; (6 pages).

\* cited by examiner

CONTACT POINT MONITORING MODULE DEVICE FOR VACUUM CIRCUIT BREAKER AND VACUUM CIRCUIT BREAKER COMPRISING SAME

CROSS-REFERENCE TO RELATED APPLICATIONS

This application is the National Stage filing under 35 U.S.C. 371 of International Application No. PCT/KR2020/003287, filed on Mar. 9, 2020, which claims the benefit of earlier filing date and right of priority to Korea utility model Application No. 10-2019-0040647 filed on Apr. 8, 2019, the contents of which are all hereby incorporated by reference herein in their entirety.

FIELD

The present disclosure relates to a contact monitoring module device for a vacuum circuit breaker capable of monitoring a wear amount of a contact inside a vacuum interrupter, and a vacuum circuit breaker having the same.

BACKGROUND

A vacuum circuit breaker is an electrical protector that uses dielectric strength of the vacuum to protect load devices and lines from fault currents in an event of short circuits or ground faults occurring in electrical circuits.

The vacuum circuit breaker performs power transport control and power system protection. The vacuum circuit breaker has a large breaking capacity and high reliability and safety. Because the vacuum circuit breaker may be mounted in a small installation space, the breaker may be easily applied to a voltage range from a medium voltage to high voltage.

The vacuum circuit breaker includes a vacuum interrupter that blocks current, a power transmission device that transmits power to the vacuum interrupter, and a push rod that performing vertical reciprocating motion under power from the power transmission device to insert or withdraw a contact in the vacuum interrupter. In an example, Korean patent No. 10-1860348 (issue date 2018 May 16) discloses a vacuum interrupter of a vacuum circuit breaker.

The conventional vacuum interrupter disclosed in the above-mentioned prior literature includes an insulating container, a fixed electrode, a movable electrode, and an arcing shield. The fixed electrode and the movable electrode have a fixed contact and a movable contact, respectively. According to vertical movement of the movable electrode, the movable contact contacts or is removed from the fixed contact.

The fixed contact and the movable contact have wear as a current blocking operation is repeated. When a contact wear amount is above a certain amount, repair or replacement is necessary. When the repair or replacement of the contact is not carried out in an appropriate time, short-time performance, short-circuit performance, and conductance performance of the vacuum interrupter may deteriorate. Therefore, it is necessary to detect a correct wear state of the contact.

SUMMARY

A purpose of the present disclosure is to provide a contact monitoring module device for a vacuum circuit breaker capable of monitoring a wear amount of a contact inside a vacuum interrupter, and a vacuum circuit breaker having the same.

Purposes of the present disclosure are not limited to the above-mentioned purpose. Other purposes and advantages of the present disclosure that are not mentioned above may be understood based on following descriptions, and will be more clearly understood with reference to embodiments of the present disclosure. Further, it will be readily apparent that the purposes and advantages of the present disclosure may be realized using means and combinations thereof indicated in the Claims.

The present disclosure provides a contact monitoring module for a vacuum circuit breaker, wherein the vacuum circuit breaker includes a push rod assembly coupled to a movable electrode of a vacuum interrupter to raise up or lower down the movable electrode to bring the movable contact into a contact closed or inserted state or a contact open or withdrawn state, wherein the contact monitoring module includes: a linear sensor coupled to a bottom of the push rod assembly to detect a displacement according to a moving direction of a push rod; and a sensor holder installed adjacent to the bottom of the push rod assembly, wherein the sensor holder is coupled to the linear sensor to process a signal transmitted from the linear sensor.

In one implementation of the contact monitoring module, the linear sensor is coupled to a bottom of a main lever transmitting the driving force generated from the mechanism assembly to the push rod assembly.

In one implementation of the contact monitoring module, the main lever includes: first and second links, wherein each of the first and second links has one end pivotally coupled to an output shaft of the mechanism assembly, and an opposite end extending towards an opposite side of the mechanism assembly thereto and fixed to an insulating housing of the vacuum circuit breaker; a plurality of connecting pins for connecting the first link and the second link to each other; and a connector disposed between and connected to the first link and the second link to connect the first link and the second link to the push rod.

In one implementation of the contact monitoring module, the linear sensor and the sensor holder is disposed under the vacuum interrupter and the push rod assembly, wherein one end of the linear sensor and the sensor holder is installed on one side of a top face of a vehicle supporting the vacuum interrupter and the push rod assembly.

In one implementation of the contact monitoring module, the linear sensor is coupled to a bottom of the connector of the main lever.

Further, the present disclosure provides a vacuum circuit breaker comprising: a body in which a mechanism assembly for generating a driving force is installed; an insulating housing installed on one side of the body; a vacuum interrupter module housed in the insulating housing, wherein the vacuum interrupter module includes: a vacuum interrupter having a fixed contact and a movable contact inside an insulating container; a push rod assembly for receiving the driving force from the mechanism assembly to contact the movable contact and the fixed contact each other or remove the movable contact and the fixed contact from each other; and a main lever coupled to an output shaft of the mechanism assembly to transmit the driving force to the push rod assembly; and a contact monitoring module installed under the vacuum interrupter module to detect a displacement according to a moving direction of the push rod assembly.

In one implementation of the vacuum circuit breaker, the breaker further comprises a vehicle movably supporting the body and the vacuum interrupter module on a top face of the vehicle, wherein the main lever includes: a pair of links coupled to each other while one end of a push rod of the push rod assembly is disposed therebetween; and a connector coupled to said one end of the push rod.

In one implementation of the vacuum circuit breaker, the contact monitoring module includes: a linear sensor having one end coupled to the connector to detect a displacement according to a moving direction of the push rod; and a sensor holder having one end coupled to the vehicle and an opposite end coupled to the linear sensor to support the linear sensor, and wherein the sensor holder outputs an output signal based on a detection result from the linear sensor.

Technical Effect

The contact monitoring module for the vacuum circuit breaker according to the present disclosure may directly measure the wear amount of the contact, and thus may monitor the contact wear amount in real time.

Further, the contact monitoring module for the vacuum circuit breaker according to the present disclosure may determine the contact wear amount before the contact wear amount exceeds a threshold, and thus may determine an appropriate maintenance time. Accordingly, reliability and performance of the vacuum circuit breaker may be improved.

The above-described effects, and specific effects of the present disclosure as not mentioned above will be described based on specific details for carrying out the disclosure.

DETAILED DESCRIPTION

Figure 1:
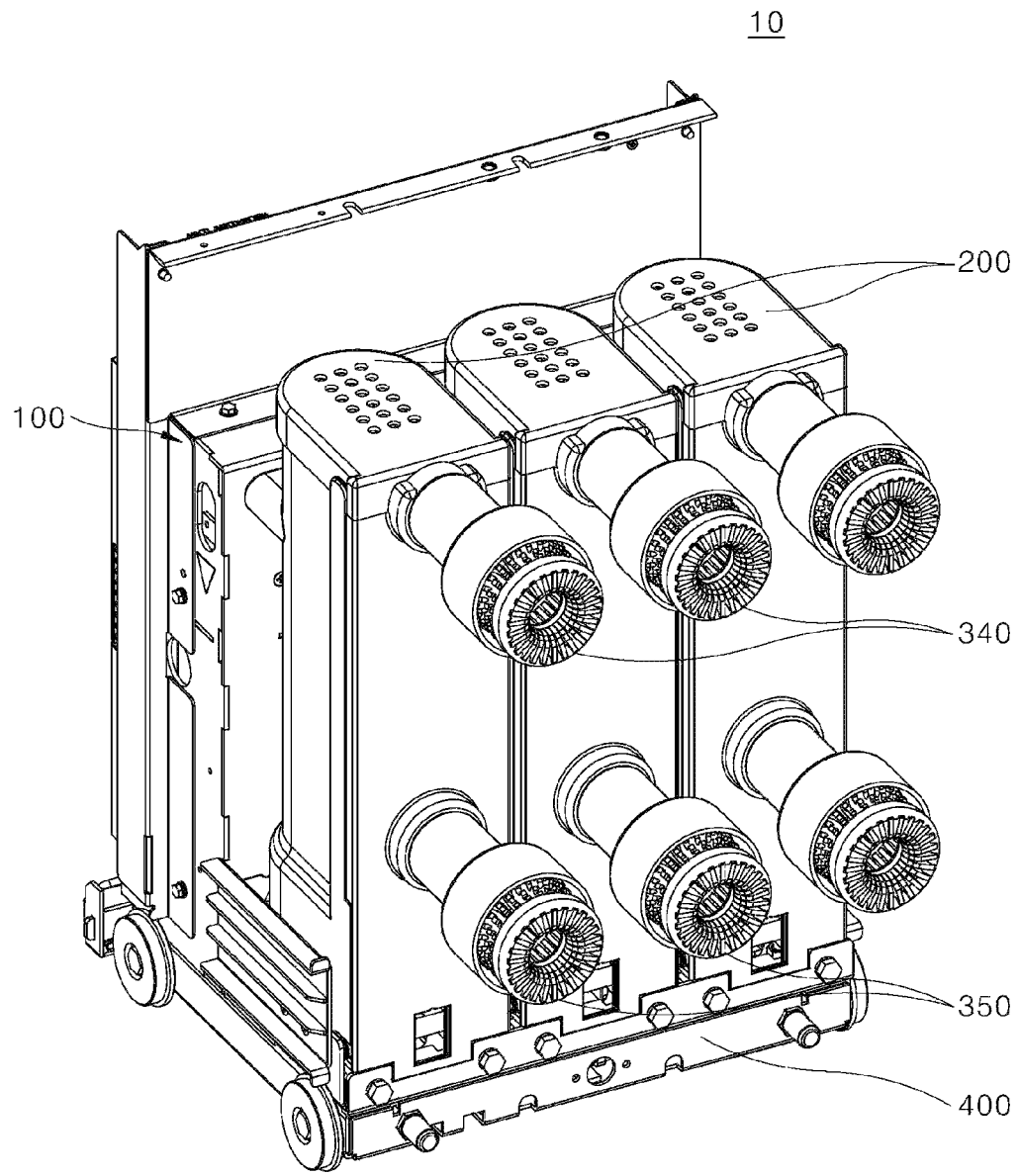
FIG. 1 is a perspective view showing a vacuum circuit breaker to which a contact monitoring module according to an embodiment of the present disclosure is applied.

The above objects, features and advantages will be described in detail later with reference to the accompanying drawings. Accordingly, a person with ordinary knowledge in the technical field to which the present disclosure belongs will be able to easily implement the technical idea of the present disclosure. In describing the present disclosure, when it is determined that a detailed description of a identified component related to the present disclosure may unnecessarily obscure gist the present disclosure, the detailed description is omitted. Hereinafter, a preferred embodiment according to the present disclosure will be described in detail with reference to the accompanying drawings. In the drawings, the same reference numerals are used to indicate the same or similar elements.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Figure 2:
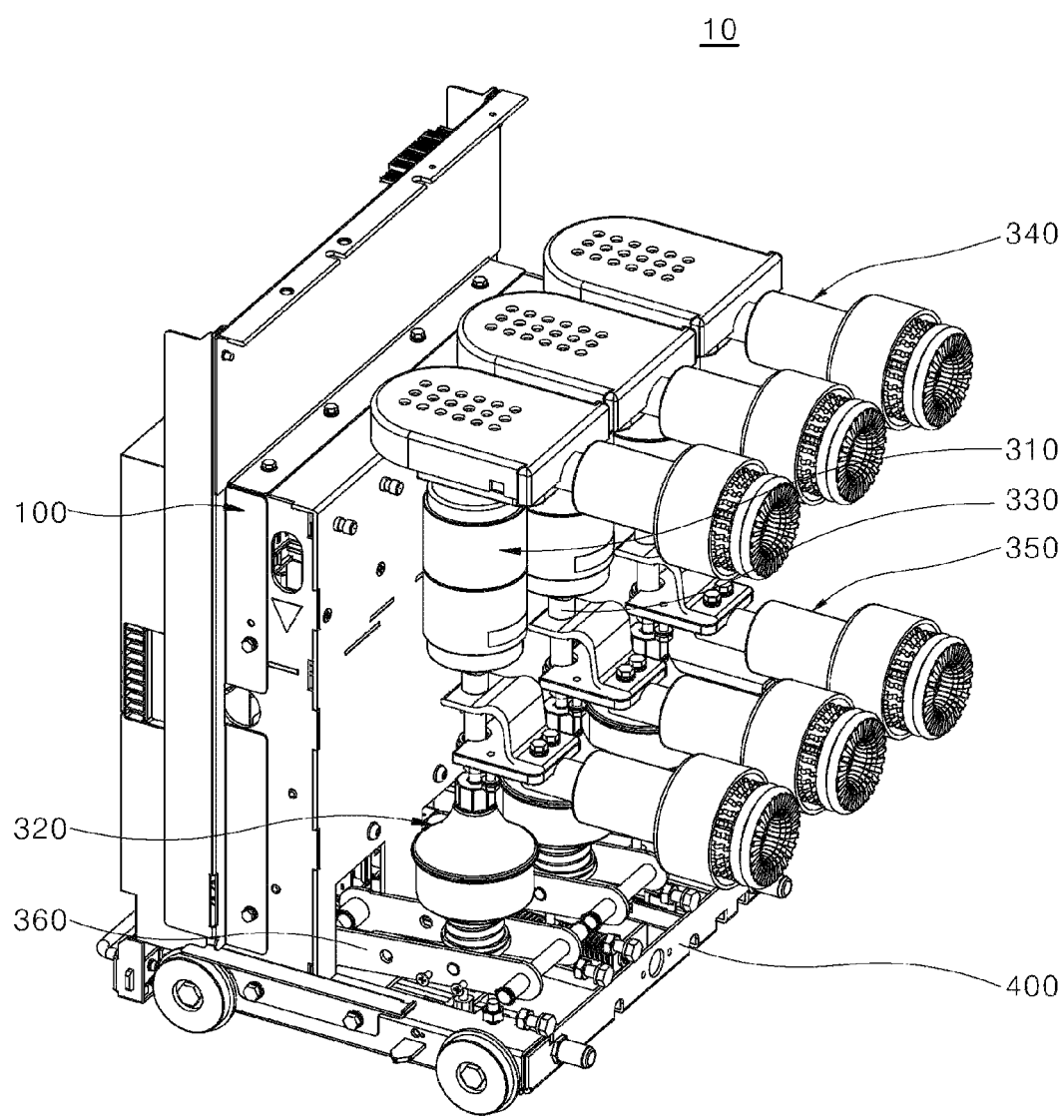
FIG. 2 is a perspective view showing a portion of an inside of the vacuum circuit breaker according to FIG. 1.
Figure 3:
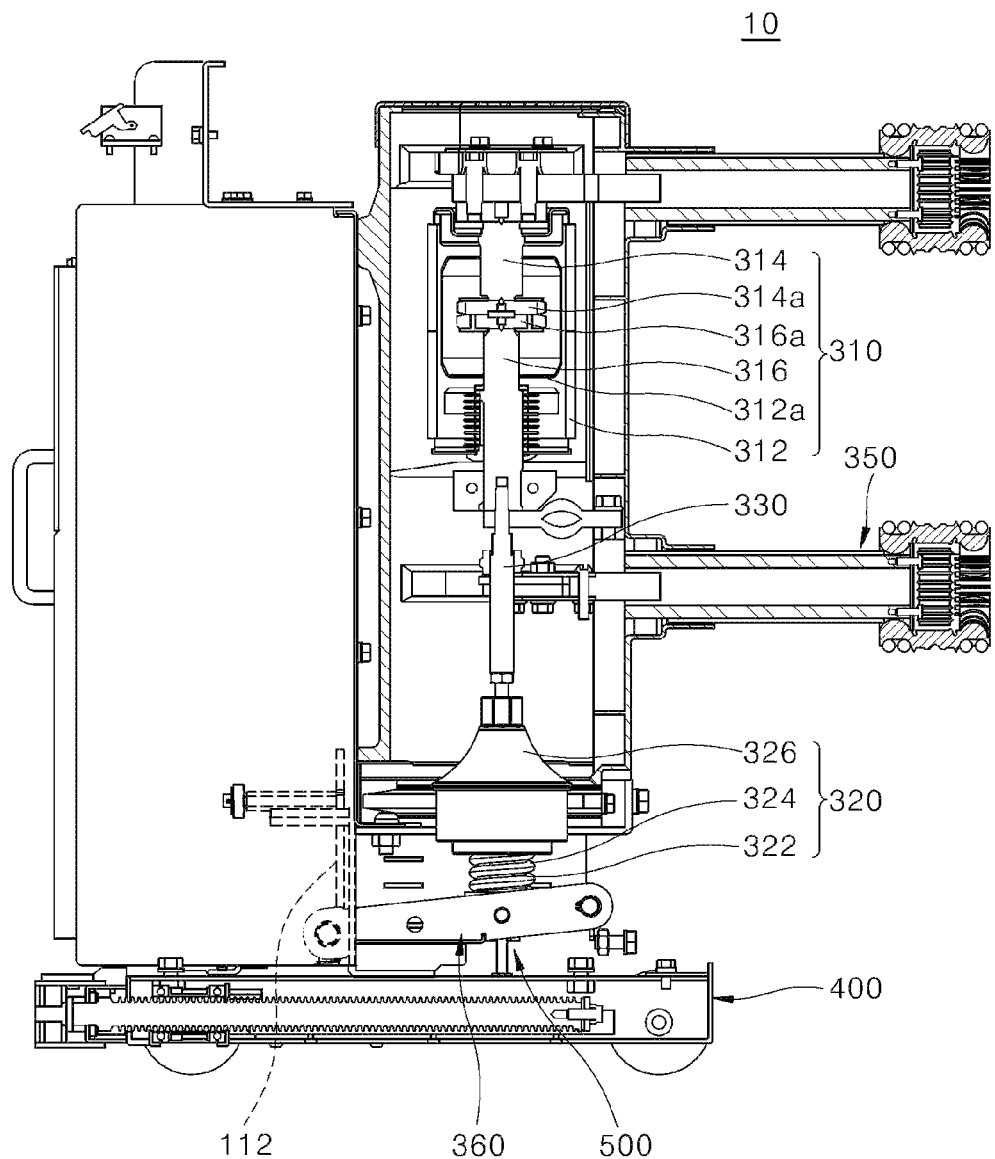
FIG. 3 is a cross-sectional view showing a portion of an inside of the vacuum circuit breaker according to FIG. 1.
Figure 4:
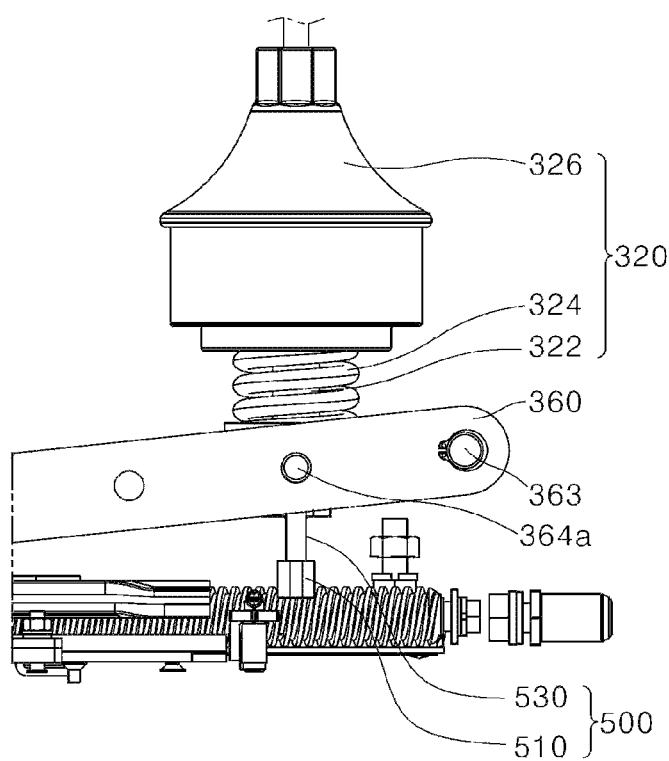
FIG. 4 is an enlarged side view of main components of the vacuum circuit breaker according to FIG. 1.
Figure 5:
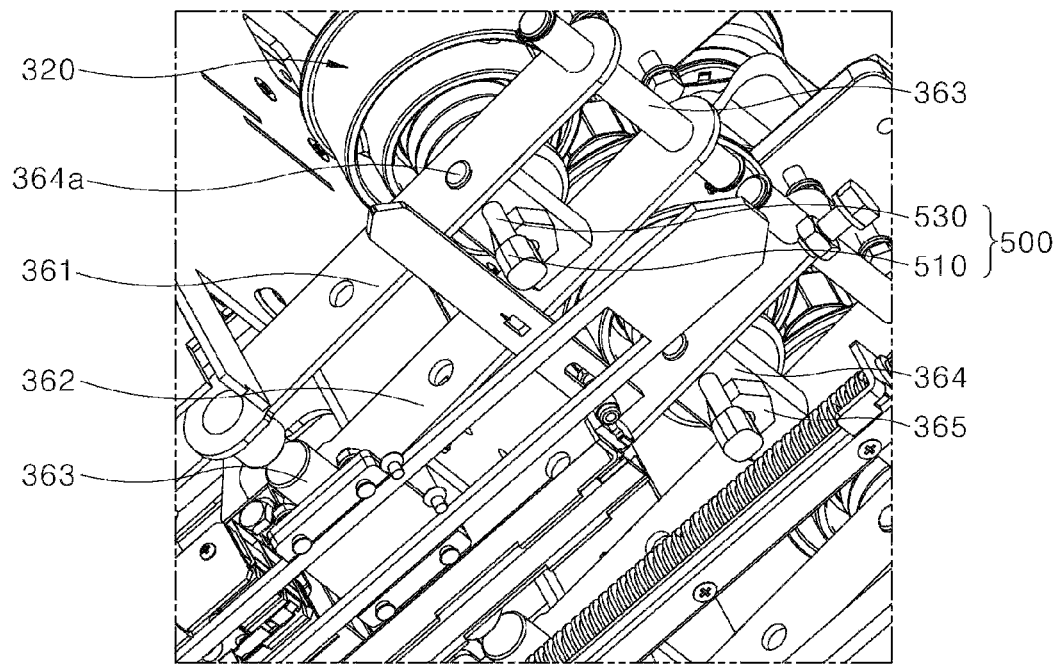
FIG. 5 is a perspective view showing an installed state of the contact monitoring module according to FIG. 2 at another angle.
Figure 6:
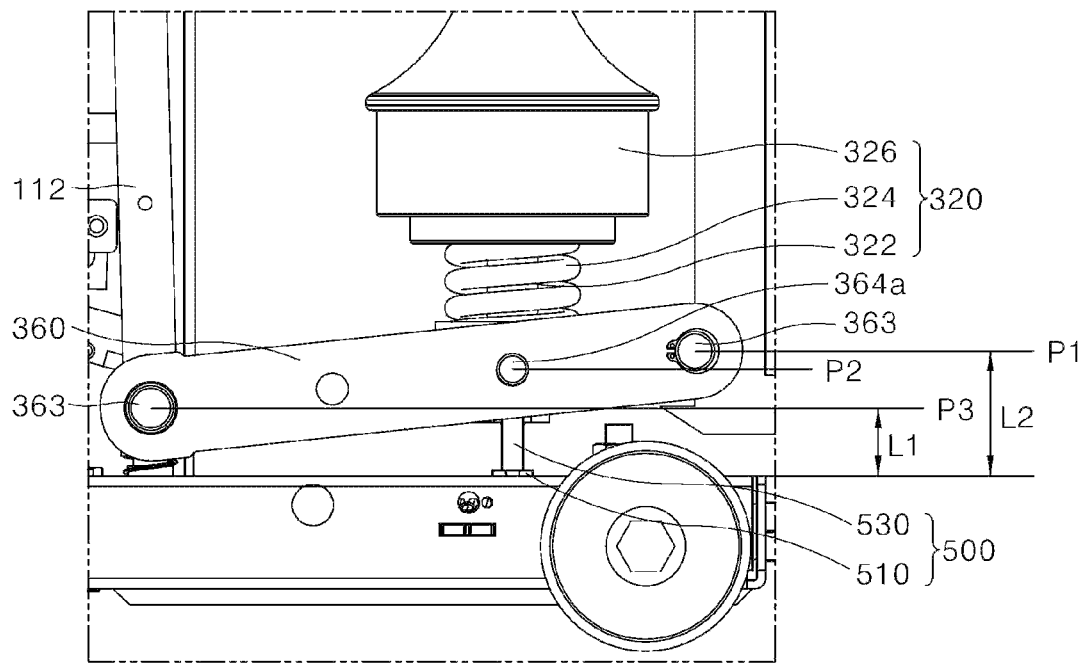
FIG. 6 is a side view of main components showing a contact open or withdrawn state of the vacuum circuit breaker according to the present disclosure.
Figure 7:
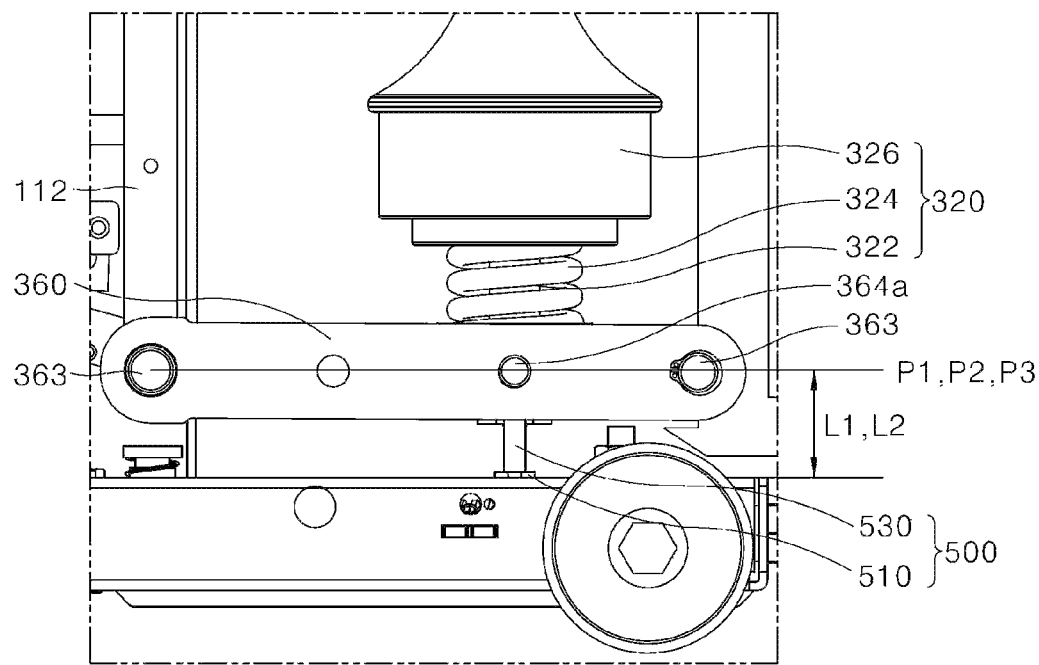
FIG. 7 is a side view of main components showing a contact closed or inserted state of the vacuum circuit breaker according to the present disclosure.
Figure 8:
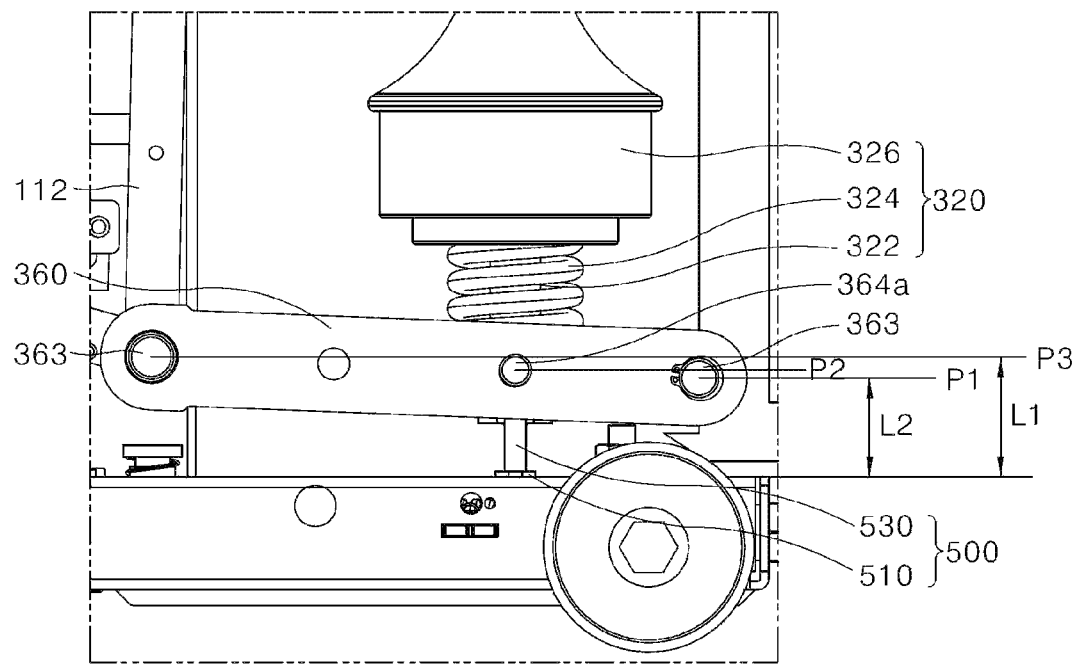
FIG. 8 is a side view of main components showing a maximum contact wear state of the vacuum circuit breaker according to the present disclosure.

FIG. 1 is a perspective view showing a vacuum circuit breaker to which a contact monitoring module according to an embodiment of the present disclosure is applied. FIG. 2 is a perspective view showing a portion of an inside of the vacuum circuit breaker according to FIG. 1. FIG. 3 is a cross-sectional view showing a portion of an inside of the vacuum circuit breaker according to FIG. 1. FIG. 4 is an enlarged side view of main components of the vacuum circuit breaker according to FIG. 1. FIG. 5 is a perspective view showing an installed state of the contact monitoring module according to FIG. 2 at another angle. FIG. 6 is a side view of main components showing a contact open or withdrawn state of the vacuum circuit breaker according to the present disclosure. FIG. 7 is a side view of main components showing a contact closed or inserted state of the vacuum circuit breaker according to the present disclosure. FIG. 8 is a side view of main components showing a maximum contact wear state of the vacuum circuit breaker according to the present disclosure.

Referring to FIG. 1 and FIG. 2, a vacuum circuit breaker 10 according to an embodiment of the present disclosure includes a body 100 in which a mechanism assembly (not shown) for generating a driving force is installed, an insulating housing 200 installed on one side of the body 100, a vacuum interrupter module 300 accommodated in the insulating housing 200, and a vehicle 400 movably supporting the body 100 and the insulating housing 200. The vehicle 400 is inserted into or withdrawn from a cradle (not shown), and thus the vacuum interrupter module 300 contacts or is removed from a bus terminal (not shown) and a load terminal (not shown). A contact monitoring module 500 for the vacuum circuit breaker is installed under the vacuum interrupter module 300 to monitor contact wear.

The body 100 receives the mechanism assembly therein that generates a driving force. The driving force generated by the mechanism assembly is transmitted to an outside of the body 100 via a plurality of links and shafts. The driving force is transmitted to the vacuum interrupter module 300 via a main lever 360 as a bottom portion of the vacuum interrupter module 300. The body 100 is mounted on a top face of the vehicle 400, and the insulating housing 200 is coupled to one side of the body.

The insulating housing 200 is mounted on a top face of the vehicle 400 while accommodating therein the vacuum interrupter module 300. The insulating housing 200 includes a plurality of insulating housings corresponding to a plurality of vacuum interrupter modules 300. A terminal of the vacuum interrupter module 300 is exposed through one open side of the insulating housing 200.

As shown in FIG. 2 and FIG. 3, the vacuum interrupter module 300 includes a vacuum interrupter 310 having a contact therein, a push rod assembly 320 for inserting or withdrawing the contact, a connecting rod 330 that transmits a driving force of the push rod assembly 320 to the vacuum interrupter 310, and an upper terminal assembly 340 and a lower terminal assembly 350 connected to the connecting rod 330 and respectively coupled to a top and a bottom of the vacuum interrupter 310. The upper terminal assembly 340 and the lower terminal assembly 350 are electrically connected to the bus terminal (not shown) and the load terminal (not shown) of the cradle (not shown). The main lever 360 is connected to a bottom of the push rod assembly 320 to transmit the driving force to the push rod assembly 320.

The vacuum interrupter 310 includes an insulating container 312 having an accommodating space defined therein, a fixed electrode 314 fixed to an inner top face of the insulating container 312, a fixed contact 314a provided at an end of the fixed electrode 314, a movable electrode 316 movably installed on an inner bottom face of the insulating container 312, and a movable contact 316a that is provided at an end of the movable electrode 316. An arc shield 312a that generates a vacuum is accommodated inside the insulating container 312. The arc shield 312a surrounds the fixed electrode 314 and the fixed contact 314a, and the movable electrode 316 and the movable contact 316a. The movable contact 316a may be brought into in an inserted state in which the movable contact 316a comes into contact with the fixed contact 314a under movement of the movable electrode 316 or may be brought into a withdrawn state (open state) in which the movable contact 316a is spaced from the fixed contact 314a. The movable electrode 316 ascends or descends under movement of the push rod assembly 320.

The push rod assembly 320 inserts or withdraws the movable electrode 316. The push rod assembly 320 includes a push rod 322 that transmits the power of the main lever 360 to the movable electrode 316, a rod spring 324 that elastically supports the push rod 322, and a rod housing 326 that receives the push rod 322 and a portion of the rod spring 324. The push rod 322 is connected to the movable electrode 316 via the connecting rod 330.

The push rod 322 is raised or lowered by the main lever 360 to raise or lower the connecting rod 330. The connecting rod 330 is raised or lowered by the push rod 322 to raise or lower the movable electrode 316.

A state in which the movable electrode 316 rises up such that the movable contact 316a comes into contact with the fixed contact 314a is referred to as a "contact closed or inserted" state. Conversely, a state in which the movable electrode 316 descends such that the movable contact 316a is removed from the fixed contact 314a is refereed to a 'contact open or withdrawn' state. In the contact closed or inserted state, the fixed contact 314a and the movable contact 316a are in electrical contact with each other while in the contact open or withdrawn state, the fixed contact 314a and the movable contact 316a are removed from each other to block the current. The vacuum circuit breaker 10 becomes the contact open or withdrawn state when an accident current occurs, thereby blocking the accident current. The push rod assembly 320 is driven via the main lever 360 installed under the push rod 322.

The main lever 360 is connected to the mechanism assembly and transmits the power generated from the mechanism assembly to the push rod assembly 320. The main lever 360 has one end coupled to an output shaft 112 of the mechanism assembly and the opposite end extending toward the opposite side of the mechanism assembly thereto. The push rod 322 is connected to a certain point of the main lever 360. The push rod 322 has to be raised and lowered by the main lever 360. Thus, in order to move the push rod 322 with a small force, it is preferable that the push rod 322 is far away from the output shaft 112 of the mechanism assembly. In accordance with the present disclosure, an example in which the main lever 360 is divided into three portions and the push rod 322 is connected to a left end of a right portion among the three portions is shown with reference to FIG. 5.

A detailed structure of the main lever 360 is as follows.

As shown in FIG. 3 to FIG. 5, the main lever 360 includes a first link 361 and a second link 362, a plurality of connecting pins 363 for connecting the first link 361 and second link 362 to each other, a connector 364 that connects the first link 361 and the second link 362 to the push rod 322, and a fastening member 365 that is coupled to the connector 364.

The first link 361 and the second link 362 have the same shape and are disposed to face toward each other. Each of the first link 361 and the second link 362 is embodied as a flat bar with a predefined length. Each of both opposing ends of each of the first link 361 and the second link 362 is formed in a semicircular shape and has a through-hole defined therein into which the connecting pin is inserted.

The connecting pin 363 has a cylindrical shape and has a length sized such that the pin passes through an end of each of the first link 361 and the second link 362. The connecting pins 363 may include two connecting pins which may be respectively inserted into both ends of each of the first link 361 and the second link 362. The connecting pin 363 pivotably supports the first link 361 and the second link 362. Although not shown in detail in the drawings, one of the pair of connecting pins 363 may be connected to the mechanism assembly, and the other thereof may be coupled to the insulating housing 200. The connecting pin 363 connected to the mechanism assembly may be directly connected to the output shaft 112. Further, the main lever 360 near the connecting pin 363 may be connected to the output shaft 112.

Accordingly, one end of each of the first link 361 and the second link 362 is raised or lowered by the output shaft 112 of the mechanism assembly 110. As one end of each of the first link 361 and the second link 362 ascends and descends, the main lever 360 is displaced. Thus, the contact monitoring module 500 which will be described later detects this displacement. This will be described later.

The connector 364 is disposed between to the first link 361 and the second link 362 and is coupled to the first link 361 and the second link 362. The connector 364 is coupled to the push rod 322 by the fastening member 365. Therefore, the fastening member 365 has to pass through the connector 364. Thus, the connector 364 has a larger size than that of the fastening member 365.

The contact monitoring module 500 is installed on the connector 364. Therefore, the connector 364 is sized such that the fastening member 365 and the contact monitoring module 500 may be mounted thereon.

Further, the connector 364 should raise or lower the push rod 322 in conjunction with motion of the first link 361 and the second link 362. To this end, the connector 364 must be pivotally coupled to the first link 361 and the second link 362. The connector 364 may have a cylindrical coupling pin 364a at each of both ends thereof such that the connector is pivotably coupled to the first link 361 and the second link 362. Inserting the coupling pin 364a into the first link 361 and the second link 362 may allow the connector 364 to be pivotably coupled to the first link 361 and the second link 362.

A fixture (not shown) such as an 'E-ring' may be additionally coupled to an end of each of the connecting pin 363 and the coupling pin 364a so that the pins are not removed from the first link 361 and the second link 362 while being inserted into the links.

In order to measure an amount of movement of the push rod 322, a vertical displacement of the push rod 322 must be detected. To this end, as described above, the contact monitoring module 500 capable of detecting the vertical displacement is installed under the push rod assembly 320.

As shown in FIG. 4 and FIG. 5, the aforementioned contact monitoring module 500 is coupled to the connector 364 of the main lever 360 to detect the displacement of the push rod 322. The main lever 360 is coupled to the push rod 322, and the push rod 322 moves along a longitudinal direction of the vacuum interrupter 310. The push rod 322 is connected to the movable electrode 316 via the connecting rod 330. Therefore, when the push rod 322 moves upward or downward, the movable electrode 316 also rises up or descends. As the movable contact of the movable electrode 316 is repeatedly inserted, the contact wear amount increases. Thus, a vertical level of the movable contact gradually rises up toward the fixed contact 314a.

Accordingly, a difference between displacements of the push rod 322 in the contact open or withdrawn state and the contact closed or inserted state in the longitudinal direction of the vacuum interrupter 310 (perpendicular to a plate surface of the vehicle) may occur. Therefore, the contact monitoring module 500 may detect the displacement of the push rod 322 to indirectly monitor the wear amount of the contact of the vacuum interrupter 310.

The contact monitoring module 500 includes a sensor holder 510 coupled to the vehicle 400 and a linear sensor 530 connecting the sensor holder 510 and connector 364 to each other.

One end of the sensor holder 510 is fixed to a top face of the vehicle 400, and the opposite end thereof is connected to the linear sensor 530. The sensor holder 510 serves to mechanically support the linear sensor 530. At the same time, the sensor holder 510 functions as a processing function of a signal from the linear sensor 530. To this end, the sensor holder 510 may include a circuit (not shown) for the signal processing therein.

The sensor holder 510 may process a detection signal of the linear sensor 530 and output the processing result to an external component. An output signal output from the sensor holder 510 may vary depending on the displacement value of the linear sensor 530. Therefore, the signal output from the sensor holder 510 may be used to calculate the displacement. The signal output from the sensor holder 510 may be transmitted to an external data processing device or a smart terminal of a manager as not shown in the drawing.

The linear sensor 530 may be embodied as a sensor having a cylindrical exterior appearance, and capable of detecting a displacement in a longitudinal direction. However, the linear sensor 530 is not limited to the sensor having the above-described exterior appearance, and may be substituted with a sensor of another type as along as displacement in a linear direction may be measured thereby. One end of the linear sensor 530 is connected to the sensor holder 510 and the opposite end thereof is connected to the connector 364 of the main lever 360. Because the connector 364 is connected to a lower end of the push rod 322, the linear sensor 530 is installed on the connector 364 to detect the displacement of the push rod 322. The linear sensor 530 detects a displacement that changes when being ascending or descending and transmits a displacement value signal to the sensor holder 510.

The linear sensor 530 may be embodied as a sensor having a variable length along a longitudinal direction of the exterior appearance, and capable of detecting a variable displacement. The linear sensor 530 may be embodied as a sensor that detects a movement distance itself or detects a resistance value or a current value that varies based on a displacement. The linear sensor 530 may be applied regardless of a type thereof as long as it may detect the displacement difference occurring along the longitudinal direction.

Hereinafter, a method of monitoring the contact wear amount using the contact monitoring module 500 will be described.

In this embodiment, referring to FIG. 6, a position of a right connecting pin 363 among the connecting pins 363 of the main lever 360 is defined as P1, a connecting point between the push rod 322 and the main lever 360 is defined as P2, and a position of a left connecting pin 363 of the connecting pins 363 is defined as P3.

The push rod assembly 320 moves in a vertical direction as an up-down direction in FIG. 5. The push rod 322 does not rise up in the contact open or withdrawn state, such that the push rod always maintains the same position. In the contact open or withdrawn state, a distance from a top surface of vehicle 400 to P3 is defined as L1. A distance from the top surface of vehicle 400 to P1 is defined as L2. Therefore, a stroke (a displacement in the vertical direction) of the main lever 360 becomes (L2−L1). Further, a stroke of the vacuum interrupter 310 becomes a displacement difference ΔS between P1 and P2.

As shown in FIG. 7, in a first inserted state, the push rod assembly 320 has a certain amount of a vertical displacement. Because P1 is fixed on the insulating housing 200, the position of P1 in the first contact closed or inserted state is the same as the position in the contact open or withdrawn state. At this time, because the main lever 360 is connected to the output shaft 112 of the mechanism assembly, P3 rises up as the main lever 360 rises up. Because the push rod 322 is raised by the main lever 360, the push rod is raised up by a preset distance between the fixed contact 314a and the movable contact 316a. Accordingly, P2 also rises up.

In the first contact closed or inserted state, the stroke of the main lever 360 is the same as that in the contact open or withdrawn state. Further, in the first contact closed or inserted state, ΔS is equal to a distance between fixed contact 314a and the movable contact 316a (it is assumed that in the first contact closed or inserted state, the contact wear amount is zero).

However, as shown in FIG. 8, when the contact wear amount increases as the contact is repeatedly closed or inserted, the push rod assembly 320 rises up in the vertical direction by the increase in the contact wear amount. When the contact is repeatedly closed or inserted, the position of P2 rises up gradually. Thus, the stroke (L2−L1) of the main lever 360 gradually increases. Further, when the contact is opened or withdrawn, P2 gradually rises upwardly beyond the position of P. Thus, ΔS also increases.

The contact monitoring module 500 is mounted on a bottom face of the connector 364 to measure a displacement of P2. Therefore, when the push rod 322 gradually rises up due to the increase in the contact wear amount as the contact is repeatedly closed or inserted, ΔS gradually increases.

A ΔS value when the contact wear amount is zero may be set as a reference value, based on a distance between the fixed contact 314a and the movable contact 316a. When a current ΔS value is larger than the reference value, a difference value therebetween may be determined as the contact wear amount.

Therefore, when the contact wear amount exceeds a preset value, this situation may be notified to a manager. A subject which performs the determinations and controls as descried above may be an external data processing device connected to the sensor holder 510 or a manager connected thereto.

The contact monitoring module for the vacuum circuit breaker according to the present disclosure may directly measure the wear amount of the contact, and thus may monitor the contact wear amount in real time.

Further, the contact monitoring module for the vacuum circuit breaker according to the present disclosure may determine the contact wear amount before the contact wear amount exceeds a threshold, and thus may determine an appropriate maintenance time. Accordingly, reliability and performance of the vacuum circuit breaker may be improved.

The present disclosure as described above may be subjected to various substitutions, modifications and changes within the scope that does not depart from the technical spirit of the present disclosure by those of ordinary skill in the technical field to which the present disclosure belongs. Thus, the present disclosure is not limited to the above-described embodiments and the attached drawings.

What is claimed is:

1. A contact monitoring module for a vacuum circuit breaker, capable of monitoring a wear amount of a contact inside a vacuum interrupter, wherein the vacuum circuit breaker includes a push rod assembly coupled to a movable electrode of a vacuum interrupter to raise up or lower down the movable electrode to bring the movable electrode into a contact closed or inserted state or a contact open or withdrawn state, the contact monitoring module comprising:
    a linear sensor coupled to a bottom of the push rod assembly to detect a displacement according to a moving direction of a push rod; and
    a sensor holder installed adjacent to the bottom of the push rod assembly, wherein the sensor holder is coupled to the linear sensor to process a signal transmitted from the linear sensor,
  wherein the linear sensor is coupled to a bottom of a main lever transmitting a driving force generated from a mechanism assembly to the push rod assembly.

2. The contact monitoring module of claim 1, wherein the main lever includes:
    first and second links, wherein each of the first and second links has one end pivotally coupled to an output shaft of the mechanism assembly, and an opposite end extending towards an opposite side of the mechanism assembly thereto and fixed to an insulating housing of the vacuum circuit breaker;
    a plurality of connecting pins for connecting the first link and the second link to each other; and
    a connector disposed between and connected to the first link and the second link to connect the first link and the second link to the push rod.

3. The contact monitoring module of claim 2, wherein the linear sensor and the sensor holder are disposed under the vacuum interrupter and the push rod assembly, wherein one end of the linear sensor and the sensor holder is installed on one side of a top face of a vehicle supporting the vacuum interrupter and the push rod assembly.

4. A vacuum circuit breaker comprising:
    a body in which a mechanism assembly for generating a driving force is installed;
    an insulating housing installed on one side of the body;
    a vacuum interrupter module housed in the insulating housing, wherein the vacuum interrupter module includes:
        a vacuum interrupter having a fixed contact and a movable contact inside an insulating container;
        a push rod assembly for receiving the driving force from the mechanism assembly to contact the movable contact and the fixed contact each other or remove the movable contact and the fixed contact from each other; and
        a main lever coupled to an output shaft of the mechanism assembly to transmit the driving force to the push rod assembly; and
        a contact monitoring module installed under the vacuum interrupter module to detect a displacement according to a moving direction of the push rod assembly,
    wherein the contact monitoring module comprises:
        a linear sensor coupled to a bottom of the push rod assembly to detect a displacement according to a moving direction of a push rod; and
        a sensor holder installed adjacent to the bottom of the push rod assembly, wherein the sensor holder is coupled to the linear sensor to process a signal transmitted from the linear sensor,
    wherein the linear sensor is coupled to a bottom of a connector of a main lever transmitting the driving force generated from the mechanism assembly to the push rod assembly.

5. The vacuum circuit breaker of claim 4, wherein the breaker further comprises a vehicle movably supporting the body and the vacuum interrupter module on a top face of the vehicle,
    wherein the main lever includes:
        a pair of links coupled to each other while one end of a push rod of the push rod assembly is disposed therebetween; and
        a connector coupled to the one end of the push rod.

* * * * *